(12) United States Patent
Heng et al.

(10) Patent No.: US 8,216,887 B2
(45) Date of Patent: Jul. 10, 2012

(54) SEMICONDUCTOR CHIP PACKAGE WITH STIFFENER FRAME AND CONFIGURED LID

(75) Inventors: Stephen F. Heng, Los Gatos, CA (US);
Sanjay Dandia, San Jose, CA (US);
Chia-Ken Leong, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 450 days.

(21) Appl. No.: 12/435,147

(22) Filed: May 4, 2009

(65) Prior Publication Data
US 2010/0276799 A1 Nov. 4, 2010

(51) Int. Cl.
*H01L 21/77* (2006.01)
*H01L 21/98* (2006.01)

(52) U.S. Cl. .......................... 438/126; 257/692; 257/704

(58) Field of Classification Search .................... 438/126
See application file for complete search history.

(56) References Cited

U.S. PATENT DOCUMENTS

| | | | |
|---|---|---|---|
| 5,866,943 A | 2/1999 | Mertol | |
| 6,046,077 A | 4/2000 | Baba | |
| 6,051,888 A * | 4/2000 | Dahl | 257/778 |
| 6,114,048 A | 9/2000 | Jech et al. | |
| 6,114,763 A | 9/2000 | Smith | |
| 6,224,711 B1 | 5/2001 | Carden | |
| 6,313,521 B1 | 11/2001 | Baba | |
| 6,317,333 B1 | 11/2001 | Baba | |
| 6,445,062 B1 | 9/2002 | Honda | |
| 6,509,630 B1 | 1/2003 | Yanagisawa | |
| 6,703,704 B1 | 3/2004 | Alcoe et al. | |
| 6,756,685 B2 | 6/2004 | Tao | |
| 6,944,945 B1 | 9/2005 | Shipley et al. | |
| 6,949,404 B1 * | 9/2005 | Fritz et al. | 438/106 |
| 6,979,636 B1 | 12/2005 | Lin et al. | |
| 7,102,228 B2 | 9/2006 | Kanda | |
| 7,196,426 B2 | 3/2007 | Nakamura et al. | |
| 2001/0017408 A1 | 8/2001 | Baba | |
| 2002/0114144 A1 | 8/2002 | Kumamoto et al. | |
| 2003/0025180 A1 * | 2/2003 | Alcoe et al. | 257/659 |

(Continued)

FOREIGN PATENT DOCUMENTS

JP 9283889 10/1997

(Continued)

OTHER PUBLICATIONS

USPTO Notice of Allowance mailed Dec. 13, 2010; U.S. Appl. No. 12/198,227.

(Continued)

*Primary Examiner* — Zandra Smith
*Assistant Examiner* — Pamela E Perkins
(74) *Attorney, Agent, or Firm* — Timothy M. Honeycutt

(57) ABSTRACT

Various semiconductor chip packages and methods of assembling and making the same are disclosed. In one aspect, a method of manufacturing is provided that includes coupling a stiffener frame to a first side of a substrate. The stiffener frame has a central opening to accommodate a semiconductor chip and an outer edge surface. A semiconductor chip is coupled to the first side in the opening. A lid is coupled to the stiffener frame with an adhesive. The lid has a first edge surface set back from the outer edge surface of the stiffener frame. The adhesive is set back from the outer edge surface of the stiffener frame.

21 Claims, 4 Drawing Sheets

U.S. PATENT DOCUMENTS

| | | | |
|---|---|---|---|
| 2003/0178722 A1 | 9/2003 | Xie et al. | |
| 2004/0099958 A1 | 5/2004 | Schildgen et al. | |
| 2004/0150118 A1 | 8/2004 | Honda | |
| 2005/0230797 A1 | 10/2005 | Ho et al. | |
| 2005/0282310 A1 | 12/2005 | Zhou | |
| 2006/0208356 A1 | 9/2006 | Yamano et al. | |
| 2006/0249852 A1 | 11/2006 | Chiu et al. | |
| 2008/0001308 A1* | 1/2008 | Chen | 257/778 |
| 2008/0054490 A1 | 3/2008 | McLellan et al. | |
| 2008/0142996 A1 | 6/2008 | Subramanian et al. | |
| 2008/0272482 A1 | 11/2008 | Jensen et al. | |

FOREIGN PATENT DOCUMENTS

| | | |
|---|---|---|
| JP | 3161706 | 8/2000 |
| JP | 3180794 | 4/2001 |
| JP | 3189270 | 5/2001 |
| JP | 3219043 | 8/2001 |
| JP | 3228339 | 9/2001 |
| JP | 2002190560 | 7/2002 |
| JP | 3367554 | 11/2002 |
| JP | 3384359 | 12/2002 |
| JP | 3385533 | 1/2003 |
| JP | 2003051568 | 2/2003 |
| JP | 3459804 | 8/2003 |
| JP | 2004260138 | 9/2004 |
| JP | 200767010 | 3/2007 |

OTHER PUBLICATIONS

U.S. Appl. No. 11/748,618, filed May 15, 2007, Eric Tosaya.
U.S. Appl. No. 12/029,305, filed Feb. 11, 2008, Eric Tosaya.
U.S. Appl. No. 12/051,330, filed Mar. 19, 2008, Roden Topacio.
U.S. Appl. No. 12/198,227, filed Aug. 26, 2008, Mohammad Khan et al.
Horatio Quinones et al.; *Flip Chip Encapsulation Reliability*; ASYMTEK; Aug. 1998; pp. 1-13.
Richard Blish, Ph.D.; *Use Condition Based Reliability Evaluation of New Semiconductor Technologies*; SEMATECH; Aug. 31, 1999; pp. 1-21.
National Electronics Center of Excellence; *Empfasis-Lead Free Soldering for Sustainment*; A publication of the National Electronics Manufacturing Center for Excellence; http://www.empf.org/empfasis/oct03/3403pbsustain.htm; Mar./Apr. 2003; pp. 1-3.
K.C. Norris et al.; *Reliability of Controlled Collapse Interconnections*; IBM J. Res. Development; May 1969; pp. 1-6.
Werner Engelmaier; *Solder Joints in Electronics: Design for Reliability*; 1999; pp. 1-13.
USPTO Office Action mailed Mar. 27, 2009; U.S. Appl. No. 11/748,618.
USPTO Office Action notification date Jul. 29, 2010; U.S. Appl. No. 12/198,227.
PCT/IB2009/000561 International Search Report.
USPTO Office Action notification date Aug. 17, 2009; U.S. Appl. No. 11/748,618.
Lisa Kosanovic; *New Wires for Old*; http://www.memagazine.org/supparch/pejun04/newwires/newwires.html; Mechanical Engineering "Power & Energy,"; Jun. 2004; pp. 1-5.
Wikipedia; *Invar*; http://en.wikipedia.org/wiki/Invar; unknown date; pp. 1-2.
*Invar*; http://asuwlink.uwyo.edu/-metal/invar.html; Aug. 11, 2007; pp. 1-3.

* cited by examiner

SEMICONDUCTOR CHIP PACKAGE WITH STIFFENER FRAME AND CONFIGURED LID

BACKGROUND OF THE INVENTION

1. Field of the Invention

This invention relates generally to semiconductor processing, and more particularly to semiconductor chip packages utilizing stiffener frames and methods of making the same.

2. Description of the Related Art

Many current integrated circuits are formed as multiple dice on a common silicon wafer. After the basic process steps to form the circuits on the dice are complete, the individual dice are cut or singulated from the wafer. The singulated dice are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a material that prevents damage to the solder bumps due to mismatches in the coefficients of thermal expansion between the die and the substrate, and an adhesive to hold the die. The substrate interconnects include an array of solder pads that are arranged to line up with the die solder bumps. After the die is seated on the substrate, a reflow process is performed to enable the solder bumps of the die to metallurgically link to the solder pads of the substrate. After the die is mounted to the substrate, a lid is attached to the substrate to cover the die. Some conventional integrated circuits, such as microprocessors, generate sizeable quantities of heat that must be ferried away to avoid device shutdown or damage. For these devices, the lid serves as both a protective cover and a heat transfer pathway.

One conventional type of substrate consists of a core laminated between upper and lower build-up layers. The core itself usually consists of four layers of glass filled epoxy. The build-up layers, which may number four or more on opposite sides of the core, are formed from some type of resin. Various metallization structures are interspersed in the core and build-up layers in order to provide electrical pathways between pins or pads on the lowermost layer of the substrate and pads that bond with the chip solder bumps.

The core provides a certain stiffness to the substrate. Even with that provided stiffness, conventional substrates still tend to warp due to mismatches in coefficients of thermal expansion for the chip, underfill and substrate. However, there is a need to provide shorter electrical pathways in package substrates in order to lower power supply inductance and improve power fidelity for power transferred through the substrate. The difficult problem is how to reduce the electrical pathways without inducing potentially damaging substrate warping.

One conventional technique for addressing package substrate warpage involves the use of a stiffener ring on the die side of the package substrate and a lid attached to the stiffener ring, typically by glue of some sort. Some conventional stiffener rings are made of metallic materials, while others are formed from plastics. Regardless of composition, a typical conventional stiffener ring frames the die and has a flat outer surface that is vertically aligned with a corresponding flat outer surface of the lid. When the lid is secured to the stiffener frame, the glue is squeezed and may bleed out laterally, much like peanut butter from the edges of a sandwich. Even after curing, particles of the glue may sprinkle down on sensitive electronic structures, such as tiny socket structures, and cause electrical problems.

The present invention is directed to overcoming or reducing the effects of one or more of the foregoing disadvantages.

SUMMARY OF THE INVENTION

In accordance with one aspect of the present invention, a method of manufacturing is provided that includes coupling a stiffener frame to a first side of a substrate. The stiffener frame has a central opening to accommodate a semiconductor chip and an outer edge surface. A semiconductor chip is coupled to the first side in the opening. A lid is coupled to the stiffener frame with an adhesive. The lid includes a first flange with a first outer edge surface set back from the outer edge surface of the stiffener frame. The adhesive is set back from the outer edge surface of the stiffener frame.

In accordance with another aspect of the present invention, a method of manufacturing is provided that includes forming a stiffener frame with a central opening to accommodate a semiconductor chip and an outer edge surface. The stiffener frame is coupled to a first side of a substrate. A semiconductor chip is coupled to the first side in the central opening. A lid is formed with a central portion sized to project into the opening and a first flange adapted to seat on the stiffener frame with a first outer edge surface set back from the outer edge surface of the stiffener frame. The lid is coupled to the stiffener frame with an adhesive set back from the outer edge surface of the stiffener frame.

In accordance with another aspect of the present invention, an apparatus is provided that includes a substrate that has a first side. A semiconductor chip is coupled to the first side. A stiffener frame is coupled to the first side and has a central opening to accommodate the semiconductor chip and an outer edge surface. A lid is coupled to the stiffener frame. The lid has a first flange with a first outer edge surface set back from the outer edge surface of the stiffener frame. An adhesive is set back from the outer edge surface of the stiffener frame and couples the lid to the stiffener frame.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip package with a stiffener frame and a configured lid are described herein. One example includes a stiffener frame that has a laterally inwardly projecting extension that provides a seating surface for an adhesive. The lid is configured with a first flange that seats on the frame extension and provides a surface that readily attracts the adhesive at a setback distance from the edge of the stiffener frame. Additional details will now be described.

Figure 1:
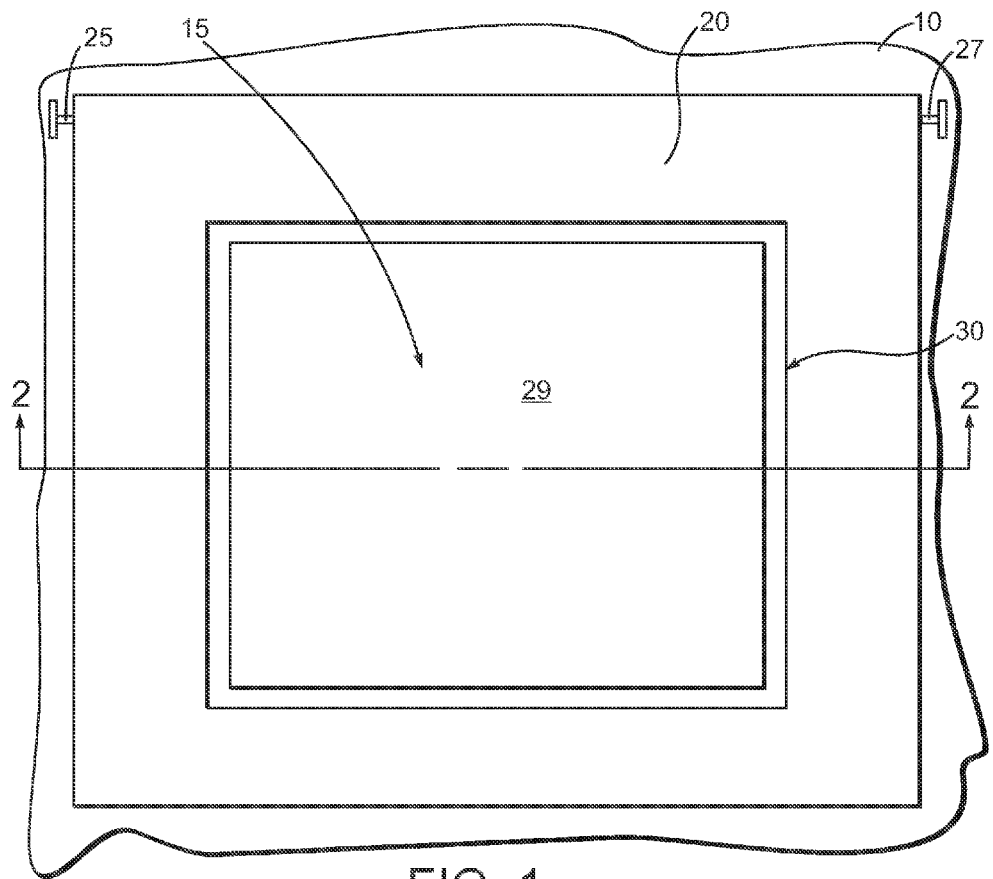
FIG. 1 is an overhead view of a small portion of a printed circuit board and an exemplary embodiment of a semiconductor chip package secured thereto.

In the drawings described below, reference numerals are generally repeated where identical elements appear in more than one figure. Turning now to the drawings, and in particular to FIG. 1, therein is shown FIG. 1 which is an overhead view of a small portion of a printed circuit board 10 and a semiconductor chip package 15 secured to the printed circuit board 10 by way of a clamp 20. The printed circuit board 10 may be virtually any type of circuit board. Examples include motherboards, circuit cards or the like. The clamp 20 is pivotable into and out of the page by way of pivot pins 25 and 27 that connect the clamp 20 to the printed circuit board 10. Another mechanism (not shown) secures the clamp 20 in the closed position shown in FIG. 1. The semiconductor chip package 15 includes a lid or heat spreader 29. The clamp 20 includes a cutout 30 that is dimensioned to accommodate the lid 29.

Figure 2:
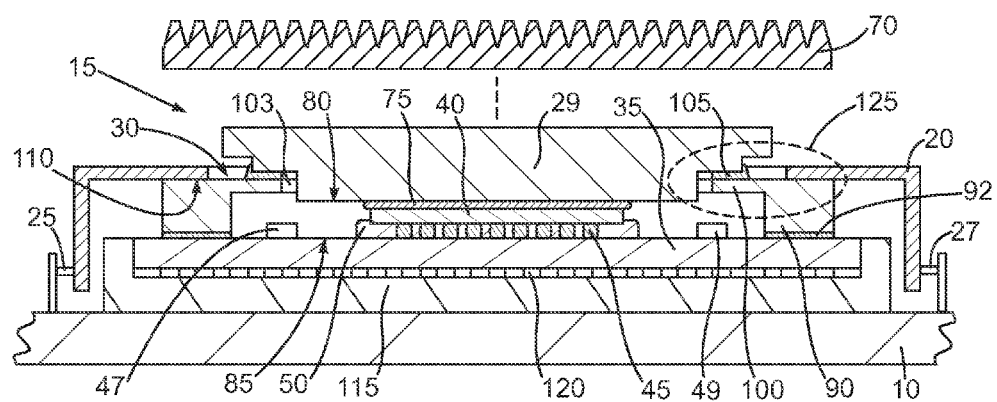
FIG. 2 is a sectional view of FIG. 1 taken at section 2-2.

Additional detail of the semiconductor chip package 15 may be understood by referring now also to FIG. 2, which is a sectional view of FIG. 1 taken at section 2-2. The semiconductor chip package 15 includes a base or carrier substrate 35 upon which a semiconductor chip 40 is mounted and electrically connected thereto by way of a plurality of solder joints 45. The carrier substrate 35 may be composed of ceramics or organic materials as desired. If organic, the substrate 35 may actually consist of multiple layers of metallization and dielectric materials. The substrate 35 may interconnect electrically with external devices, such as a socket, in a variety of ways, such as the depicted land grid array, or optionally a pin grid array, a ball grid array or other configuration. The number of individual layers for the substrate 35 is largely a matter of design discretion. In certain exemplary embodiments, the number of layers may vary from two to sixteen. If such a build-up design is selected, a standard core, thin core or coreless arrangement may be used. The dielectric materials may be, for example, epoxy resin with or without fiberglass fill. The carrier substrate 35 may be provided with one or more passive devices 47 and 49 which may be capacitors, resistors, inductors or other components.

The semiconductor chip 40 may be any of a myriad of different types of circuit devices used in electronics, such as, for example, microprocessors, graphics processors, combined microprocessor/graphics processors, application specific integrated circuits, memory devices or the like, and may be single or multi-core. Multiple planar and/or stacked dice may be used. The semiconductor chip 40 may be fabricated using silicon, germanium or other semiconductor materials. If desired, the semiconductor chip 40 may be fabricated as a semiconductor-on-insulator substrate or as bulk semiconductor.

The solder joints 45 may be composed of lead-based solders, lead-free solders, or combinations of the two. It should be understood that other types of interconnection schemes could be used, such as, conductive pillars, wire bonds or other interconnects as desired.

An underfill material layer 50 is interposed between the semiconductor chip 40 and the substrate 35 in order to lessen the effects of differential coefficients of thermal expansion between the substrate 35, the solder joints 45 and the semiconductor chip 40. Well-known epoxy or other resins may be used for the underfill.

The lid 29 may be composed of well-known plastics, ceramics or metallic materials as desired. Some exemplary materials include nickel plated copper, anodized aluminum, aluminum-silicon-carbide, aluminum nitride, boron nitride or the like. In an exemplary embodiment, the lid 29 may consist of a nickel plated copper. An optional heat sink 70 may be seated on the lid 29. The optional heat sink 70 was not included in FIG. 1 for clarity of illustration. A thermal interface material 75 may be interposed between the semiconductor chip 40 and the lower surface 80 of the lid 29. The thermal interface material 75 is advantageously composed of metallic materials, such as indium, but may also be composed of polymeric materials such as, for example, silicone rubber mixed with aluminum particles and zinc oxide. Optionally, compliant base materials other than silicone rubber and thermally conductive particles other than aluminum may be used. A thermal interface material (not shown) may be interposed between the heat sink 70 and the lid 29.

The upper surface 85 of the carrier substrate 35 is provided with a stiffener frame 90 that may be secured to the surface 85 by an adhesive 92. The adhesive 92 may be a polymeric material, such as an epoxy, or a solder. The stiffener frame 90 is designed to provide, as its name implies, a stiffening for the carrier substrate 35. This provision for an enhanced stiffening of the carrier substrate 35 may be particularly advantageous in situations where the substrate 35 is configured as a so-called thin core or coreless. The stiffener frame 90 may have a generally rectangular cross-section and an overhang 100 that projects inwardly laterally terminating at a central opening 103 that is dimensioned to accommodate a portion of the lid 29. The purpose of the overhang 100 will be described in more detail in conjunction with FIG. 3 to be discussed below. The stiffener frame 90 may be fabricated from materials that exhibit desirable mechanical strength and some resistance to corrosion. Examples include copper, nickel, stainless steel, titanium, aluminum, various combinations of these, various polymeric compounds that moldable or otherwise fabricated, ceramics, composites of metals and ceramics or the like. The lid 29 is seated on the overhang 100 and secured thereto by an adhesive 105. As discussed more fully below, the adhesive 105 may be a polymeric compound or a solder. The clamp 20 engages an upper surface 110 of the stiffener frame 90. As noted above, the clamp 20 may be pivotable toward and away from the stiffener frame 90 by way of the pivot pins 25 and 27.

The substrate 35 is seated in a socket 115 and interconnected electrically thereto by way of a plurality of land pads 120 that make up a land grid array interconnect. Of course, other types of interconnects such as ball grid arrays, pin grid arrays, or other interconnects may be used to electrically connect the substrate 35 to the printed circuit board 10.

Figure 3:
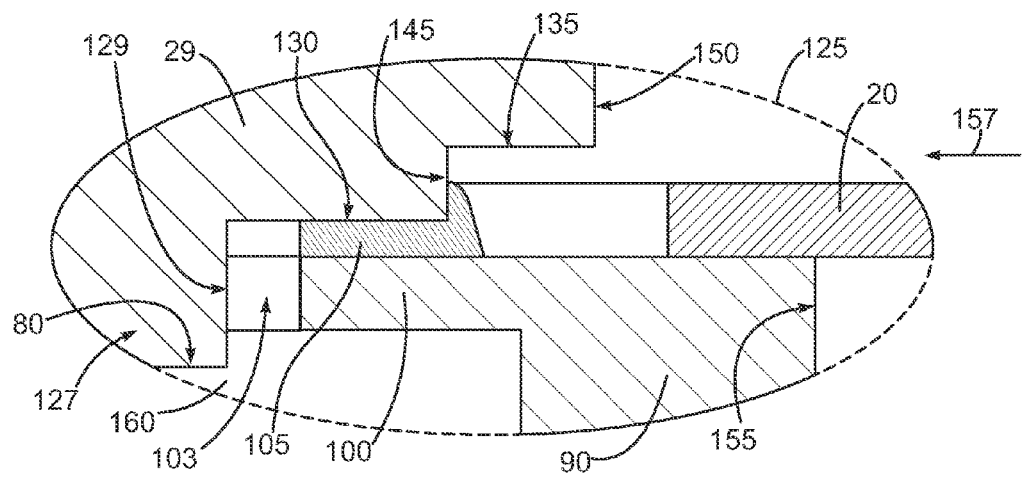
FIG. 3 is a portion of FIG. 2 shown at greater magnification.

To illustrate additional details of the lid 29 and the stiffener frame 90, a small portion of FIG. 2 circumscribed by the dashed circle 125 will be shown at greater magnification in FIG. 3. Referring now to FIG. 3, the lid 29 includes a generally multi-flanged arrangement. A central or lower portion 127 projects down through the opening 103 and terminates at the lower surface 80. The perimeter of lower portion 127 is demarcated by an edge surface 129. Proceeding upward from the lower surface 80, two flanges 130 and 135 are provided at successively larger lateral distances from the vertical edge 129 of the lower portion 127. The flanges 130 and 135 are demarcated by an edge surface 145. The flange 135 terminates laterally in an edge surface 150. The edge surface 150 may be set back from an outer edge surface 155 of the stiffener frame 90 as shown to avoid interference with the clamp 20, but could extend further out laterally if desired. The edge surface 145 is advantageously set back from the outer edge of the stiffener frame 90. As noted above, the lid 29 is secured to the overhang 100 of the stiffener frame 90 by way of the adhesive 105. By configuring the lid 29 with the flanged arrangement, and in particular with edge surface 145 of the flange 130 set back from the outer edge surface 155, a portion of the adhesive 105 will be drawn up the edge surface 145 by surface tension and held there during application and curing thereof. Furthermore, since the flange 130 and the edge surface 145 thereof are set back laterally along the direction of the arrow 157, the adhesive 105 is prevented from spilling out along a direction opposite the arrow 157 and over the outer edge surface 155 where it could release flecks or particles that could potentially interfere with the operation of the printed circuit board 10 depicted in FIGS. 1 and 2. The overhang 100 of the stiffener frame 90 provides both an enlarged surface adhesion and mechanical support area for the adhesive bead 105 and the overlying flange 130 and a significant interior space at 160 so that components such as the passives 47 and 49 shown in FIG. 2 may be readily accommodated. It is preferred though not absolutely necessary that the adhesive 105 be set back from the edge 150 to prevent interference with the clamp 20. The setback of the edge 145 provides this capability. It should be understood that the edges 145 and 150 could be aligned vertically to establish in essence a single edge flange edge that is set back from the edge 155 of the stiffener frame 90.

Figure 4:
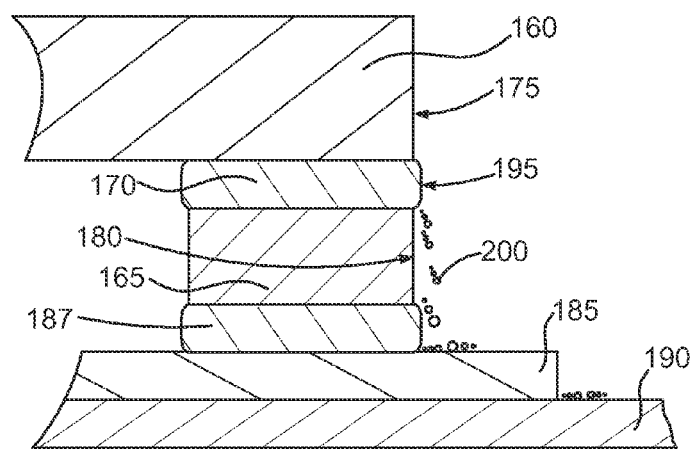
FIG. 4 is a sectional view of a portion of a conventional semiconductor chip package and stiffener frame.

It may be helpful at this point to contrast the illustrative embodiments disclosed herein with a conventional stiffener frame and lid arrangement. In this regard, attention is now turned to FIG. 4, which is a magnified sectional view not unlike FIG. 3, but of a conventional lid 160 mounted on a conventional stiffener frame 165 by way of an adhesive bead 170. Here, the outer edge 175 of the lid 160 is vertically aligned with the outer edge 180 of the conventional stiffener frame 165. The stiffener frame 165 is mounted to a package substrate 185 by an adhesive 187. The package substrate 185 is in-turn mounted to a printed circuit board 190. Because of the vertical alignment of the edge 175 of the lid 160 and the edge 180 of the stiffener frame 165, the edge 195 of the adhesive bead 170 is fully exposed and may produce flecks or particles 200 that chip off and sprinkle down on the package substrate 185 and the printed circuit board 190. These particles 200 can produce unwanted contamination of delicate circuit structures. In addition, the edge 195 of the adhesive bead 170 could protrude beyond the edge 180 and interfere with a clamp (not shown).

Figure 5:
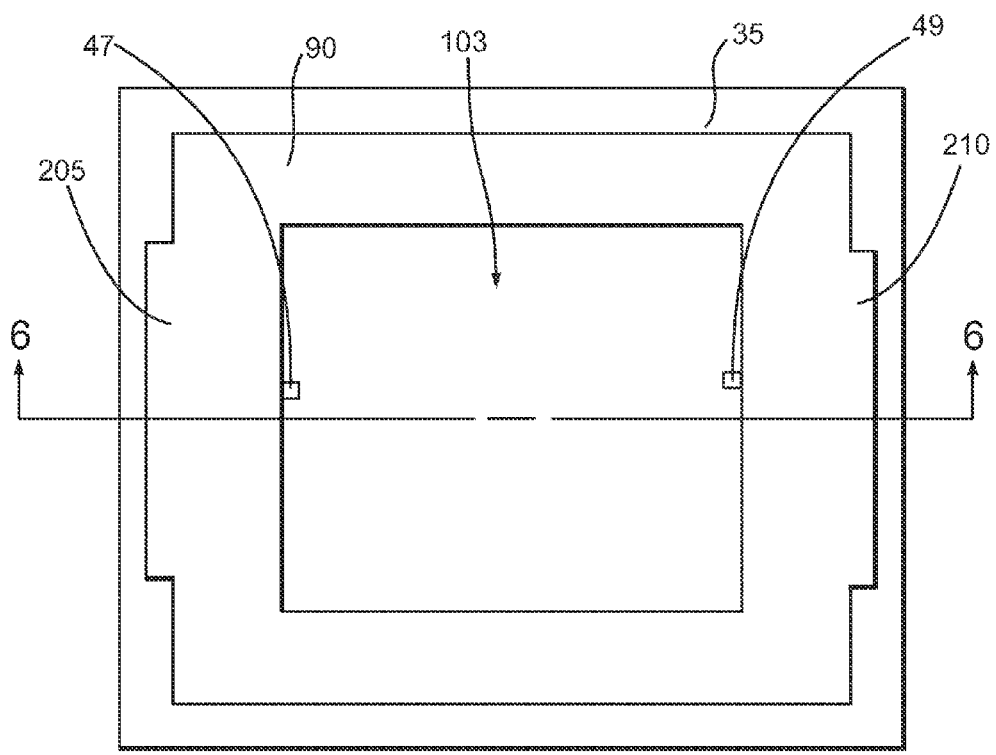
FIG. 5 is an overhead view of an exemplary embodiment of a stiffener frame positioned on a substrate.
Figure 6:
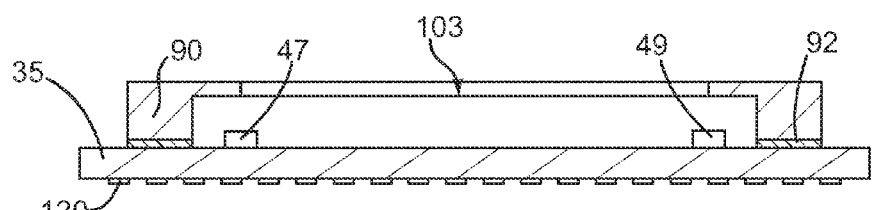
FIG. 6 is a sectional view of FIG. 5 taken at section 6-6.

An exemplary method for fabricating the semiconductor chip package 15 may be understood by referring now to FIGS. 5, 6, 7 and 8 and initially to FIGS. 5 and 6. FIG. 5 is an overhead view of the carrier substrate 35 and FIG. 6 is a sectional view of FIG. 5 taken at section 6-6. FIGS. 5 and 6 depict the carrier substrate 35 following application thereto of the passive devices 47 and 49, the land pads 120 and the stiffener frame 90. The stiffener frame 90 may be fabricated by casting, forging, plating, stamping, machining, molding, combinations of these or other techniques. In order to provide additional seating area for the subsequently activated clamp 20 shown in FIGS. 1, 2 and 3, the stiffener frame 90 may be provided with one or more optional extensions, two of which are shown and labeled 205 and 210, respectively. While the stiffener frame 90 is continuous, segmented configurations are envisioned. The opening 103 in the stiffener frame 90 is given adequate dimensions to accommodate the subsequently applied lid 29 depicted in FIGS. 1, 2 and 3. The adhesive 92 may be applied to the stiffener frame 90, the substrate 35 or both. The stiffener frame 90 is next seated on the adhesive 92 and a curing process is performed. The type of cure will depend on how the adhesive 92 is activated. Examples include thermal and light-induced cures. Exemplary adhesives include, for example, LA650S available from Momentive or EA6800 and EA 6700 available from Dow Corning.

Figure 7:
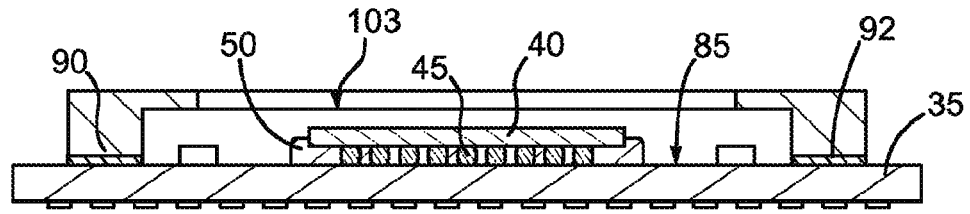
FIG. 7 is a sectional view like FIG. 6 depicting an exemplary method of coupling a semiconductor chip to the substrate.

Referring now to FIG. 7, the semiconductor chip 40 may be secured to the substrate 35 by way of the aforementioned solder joints 45 or other interconnect devices as desired. Here, the opening 103 provides access to the upper surface 85 of the substrate for the attachment of the semiconductor chip 40. The solder joints 45 may be formed by collapsible bump processes which include a thermal reflow process. The underfill material layer 50 may be applied by capillary deposition, or some other technique following a solder reflow. The underfill 50 is subjected to a curing process that may be thermal or via light stimulation. If desired, the cure of the underfill 50 might coincide with the cure of the adhesive 92 to secure the stiffener frame 90. It should be understood that the stiffener frames disclosed herein may be attached to a substrate before, during or after die attach and/or underfill deposition.

Figure 8:
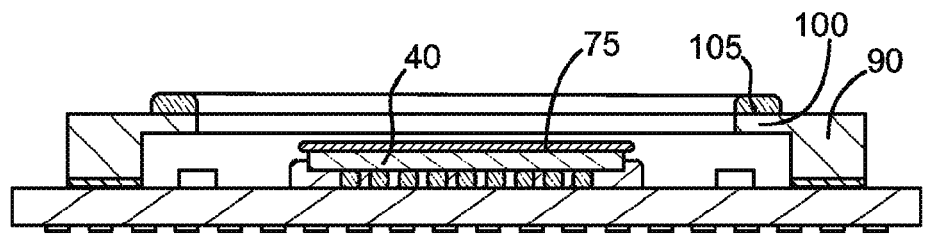
FIG. 8 is a sectional view like FIG. 7 depicting an exemplary method of placing an adhesive on the stiffener frame.
Figure 9:
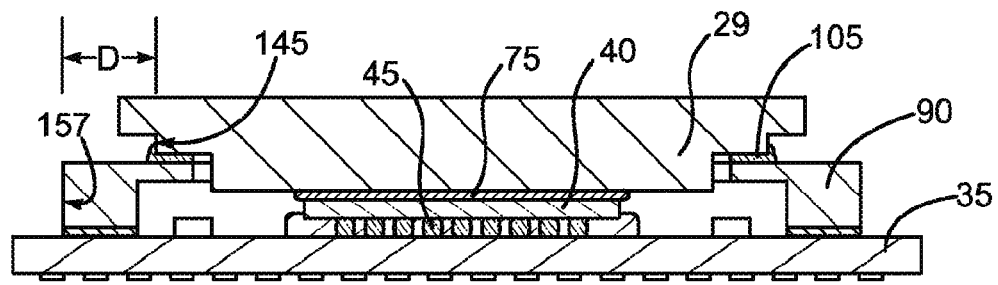
FIG. 9 is a sectional view like FIG. 8 attachment of an exemplary lid on the stiffener frame.

Referring now to FIG. 8, the adhesive 105 may be applied to the extension 100 of the stiffener frame 90 and the thermal interface material layer 75 may be applied to the semiconductor chip 40. Optionally, the thermal interface material 75 could be applied to the lid 29 depicted in the next figure. If composed of polymeric materials, the adhesive 105 may be applied by dispenser, brush or other techniques. Exemplary polymeric materials include, for example, LA650S available from Momentive or EA6800 and EA 6700 available from Dow Corning. These exemplary materials incorporate platinum and silica fillers. If desired, the adhesive 105 may be applied to the stiffener frame 90, the lid 29 shown in FIG. 9 or both. If composed of solder materials, such as indium or some other types of low melting point solders, the adhesive 105 may be applied to either the stiffener frame 90 or the lid in the form of pastes or preforms and cured by reflow. Suitable fluxes may be applied as necessary.

Referring now to FIG. 8, the lid 29 may be seated on the adhesive 105 and various curing processes may be performed in order to cure the adhesive bead 105 and to either cure or induce a metallurgical reflow of the thermal interface material 75 as necessary. During these various thermal cycles, the stiffener frame 90 will provide the desired structural reinforcement of the carrier substrate 35 so that excessive warpage of the substrate 35 that might otherwise impact the integrity of the solder joints 45 and/or the mechanical integrity of the semiconductor chip 40 itself is reduced. Unwanted land grid array socket structure open circuits due to warpage will also be avoided. Again, the setback distance, D, between the edge 145 of the lid 29 and the edge 155 of the stiffener frame 90 provides the aforementioned protection against the liberation of unwanted flecks or particles of the adhesive 105. The lid 29 may be fabricated by casting, forging, plating, machining, molding, stamping, sintering, combinations of these or other techniques.

Figure 10:
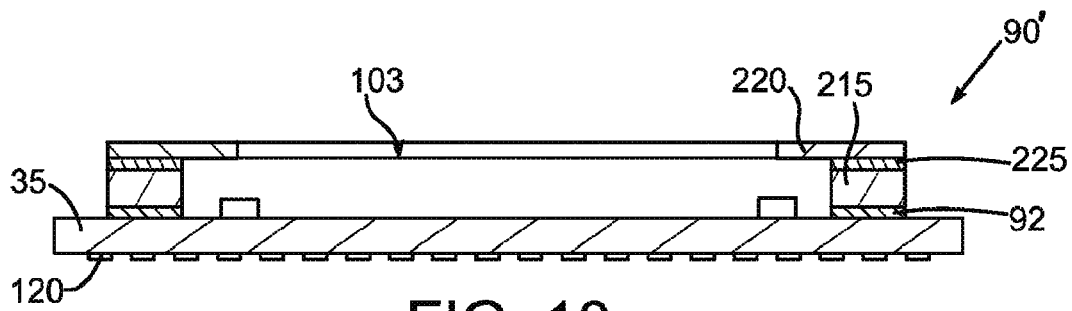
FIG. 10 is a sectional view like FIG. 6, but of an alternate exemplary stiffener frame on a substrate.

In the foregoing illustrative embodiments, the stiffener frame 90 may be configured as a unitary piece. However, it should be understood that a multi-piece stiffener frame may be used. In this regard, attention is now turned to FIG. 10, which is a sectional view of an alternate exemplary stiffener frame 90' mounted on a carrier substrate 35. FIG. 10 depicts the carrier substrate 35 and the stiffener frame 90' at about the same stage of processing as depicted for the other illustrative embodiment in FIG. 6. Here however, the stiffener frame 90' consists of a first frame member 215 that is secured to the substrate 35 by way of the adhesive 92 and a second frame member 220 that is secured to the first frame member by way of an adhesive 225. The second frame member 220 may include the centrally located opening 103 like the other illustrative embodiments described herein. Indeed, the second frame member 220 may provide the aforementioned functionality of the extension 100 described elsewhere herein and shown in FIGS. 2 and 3 and also provide a bearing surface for the clamp 20 depicted in FIGS. 1, 2 and 3. With a multi-piece arrangement, the first frame member 215 may be composed of metallic or polymeric or plastic materials and the frame member 220 can be composed of materials exhibiting perhaps greater mechanical strength, such as the metallic materials described elsewhere herein for the stiffener frame 90. The adhesives 92 and 225 may be the same types of adhesives as used for the stiffener frame 90 described elsewhere herein. The substrate 35 may be provided with plural land pads 120 or the other types of interconnects that are described elsewhere herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    coupling a stiffener frame to a first side of a substrate, the stiffener frame having a central opening to accommodate a semiconductor chip and an outer edge surface;
    coupling a semiconductor chip to the first side in the opening; and
    coupling a lid to the stiffener frame with an adhesive, the lid including a first flange with a first outer edge surface set back from the outer edge surface of the stiffener frame and the adhesive being set back from the outer edge surface of the stiffener frame.

2. The method of claim 1, wherein the adhesive comprises a polymeric material.

3. The method of claim 1, wherein the adhesive comprises a solder.

4. The method of claim 1, wherein the stiffener frame comprises an overhang extending to the opening, the adhesive being positioned on the overhang.

5. The method of claim 1, wherein lid comprises a second flange including a second outer edge surface set back from the outer edge of the stiffener frame.

6. The method of claim 1, comprises projecting a portion of the lid through the opening and making thermal contact with the semiconductor chip.

7. The method of claim 1, wherein coupling a stiffener frame comprises coupling a first frame member to the first side of the substrate and a second frame member to the first frame member, the second frame member having the opening.

8. A method of manufacturing, comprising:
    forming a stiffener frame having a central opening to accommodate a semiconductor chip and an outer edge surface;
    coupling the stiffener frame to a first side of a substrate;
    coupling a semiconductor chip to the first side in the central opening;
    forming a lid with a central portion sized to project into the opening and a first flange adapted to seat on the stiffener frame and including a first outer edge surface set back from the outer edge surface of the stiffener frame; and
    coupling the lid to the stiffener frame with an adhesive set back from the outer edge surface of the stiffener frame.

9. The method of claim 8, wherein the adhesive comprises a polymeric material.

10. The method of claim 8, wherein the adhesive comprises a solder.

11. The method of claim 8, comprising forming the stiffener frame with an overhang extending to the opening and positioning the adhesive on the overhang.

12. The method of claim 8, wherein the first outer edge surface is positioned proximate and bonds to a portion of the adhesive.

13. The method of claim 8, comprises projecting a portion of the lid through the opening and making thermal contact with the semiconductor chip.

14. The method of claim 8, wherein the forming the stiffener frame comprises forming a first frame member adapted to couple to the first side of the substrate, and a second frame member adapted to couple to the first frame member and having the opening, and coupling the second frame member to the first frame member.

15. An apparatus, comprising:
    a substrate having a first side;
    a semiconductor chip coupled to the first side;
    a stiffener frame coupled to the first side and having a central opening to accommodate the semiconductor chip and an outer edge surface;
    a lid coupled to the stiffener frame, the lid including a first flange with a first outer edge surface set back from the outer edge surface of the stiffener frame; and
    an adhesive set back from the outer edge surface of the stiffener frame and coupling the lid to the stiffener frame.

16. The apparatus of claim 15, wherein the adhesive comprises a polymeric material.

17. The apparatus of claim 15, wherein the adhesive comprises a solder.

18. The apparatus of claim 15, wherein the stiffener frame comprises an overhang extending to the opening, the adhesive being positioned on the overhang.

19. The apparatus of claim 15, wherein the lid comprises a second flange including a second outer edge surface set back from the outer edge surface of the stiffener frame.

20. The apparatus of claim 15, wherein the lid comprises a portion projecting through the opening and in thermal contact with the semiconductor chip.

21. The apparatus of claim 15, wherein the stiffener frame comprises a first frame member coupled to the first side of the substrate and a second frame member coupled to the first frame member, the second frame member having the opening.

* * * * *